US012740140B2

(12) United States Patent
Yoon et al.

(10) Patent No.: US 12,740,140 B2
(45) Date of Patent: Sep. 15, 2026

(54) SEMICONDUCTOR DEVICE HAVING HIGH-K GATE DIELECTRIC LAYERS

(71) Applicant: SK hynix Inc., Gyeonggi-do (KR)

(72) Inventors: Young Gwang Yoon, Gyeonggi-do (KR); Yun Ik Son, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 375 days.

(21) Appl. No.: 18/500,115

(22) Filed: Nov. 2, 2023

(65) Prior Publication Data

US 2024/0347538 A1 Oct. 17, 2024

(30) Foreign Application Priority Data

Apr. 12, 2023 (KR) ........................ 10-2023-0047927

(51) Int. Cl.

| | |
|---|---|
| ***H10D 84/85*** | (2025.01) |
| ***H10D 30/01*** | (2025.01) |
| ***H10D 30/69*** | (2025.01) |
| ***H10D 64/01*** | (2025.01) |
| ***H10D 64/68*** | (2025.01) |
| ***H10D 84/01*** | (2026.01) |
| ***H10D 84/03*** | (2025.01) |

(52) U.S. Cl.

CPC ....... *H10D 84/856* (2025.01); *H10D 30/0415* (2025.01); *H10D 30/701* (2025.01); *H10D 64/01* (2025.01); *H10D 64/689* (2025.01); *H10D 84/0181* (2025.01); *H10D 84/038* (2025.01)

(58) Field of Classification Search

CPC .. H10D 30/70; H10D 30/701; H10D 30/0415; H10D 84/856; H10D 84/0181

See application file for complete search history.

(56) References Cited

U.S. PATENT DOCUMENTS

| | | | | |
|---|---|---|---|---|
| 2021/0134799 | A1* | 5/2021 | Tsai | H10D 84/0184 |
| 2022/0208985 | A1* | 6/2022 | Yoon | H10D 64/681 |
| 2023/0290778 | A1* | 9/2023 | Lavric | H10D 30/43 |

FOREIGN PATENT DOCUMENTS

KR 10-2021-0129284 A 10/2021

* cited by examiner

*Primary Examiner* — Steven M Page
(74) *Attorney, Agent, or Firm* — IP&T GROUP LLP

(57) ABSTRACT

A semiconductor device includes a first gate structure including a first N-type high-k gate dielectric layer, a second gate structure comprising a first P-type high-k gate dielectric layer, a third gate structure including a second N-type high-k gate dielectric layer, and a fourth gate structure including a second P-type high-k gate dielectric layer. The first N-type high-k gate dielectric layer includes an N-type dipole material with a first concentration. The first P-type high-k gate dielectric layer includes a P-type dipole material with a second concentration. The second N-type high-k gate dielectric layer includes the N-type dipole material with a third concentration. The second P-type high-k gate dielectric layer includes the P-type dipole material with a fourth concentration. The first concentration is higher than the third concentration, and the second concentration is higher than the fourth concentration.

20 Claims, 23 Drawing Sheets

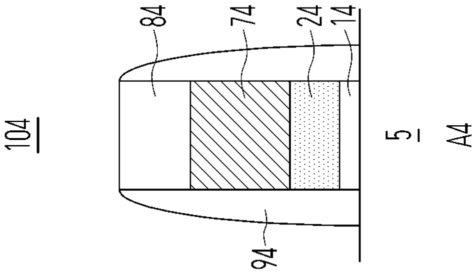
FIG. 1B
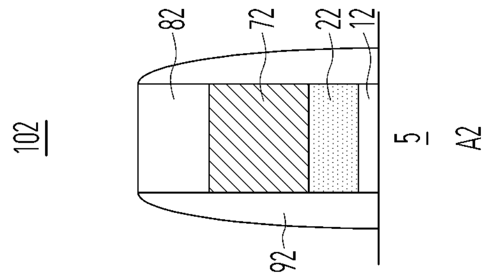
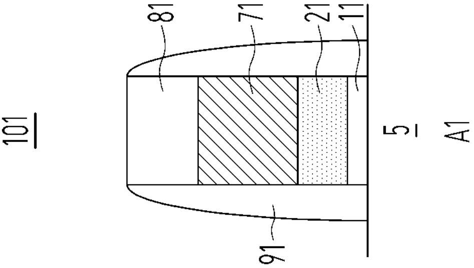

115 205 A15 285 275 244 236 225 215 295
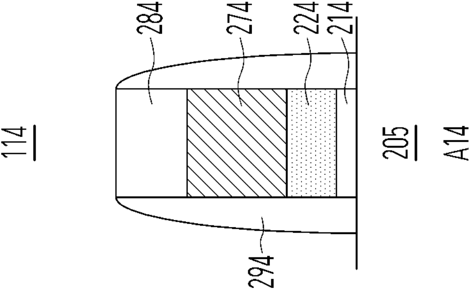
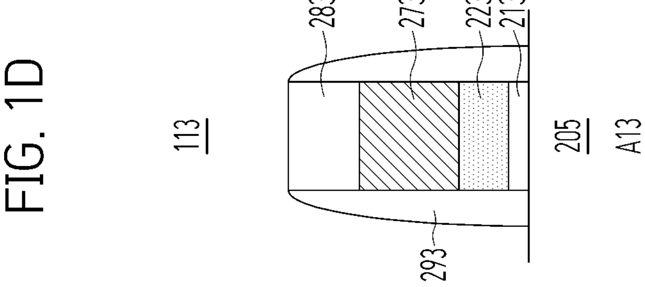
FIG. 1D
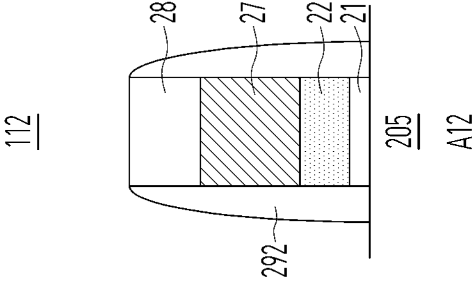
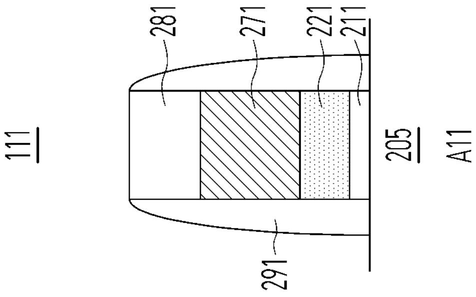

20
10
5
A3

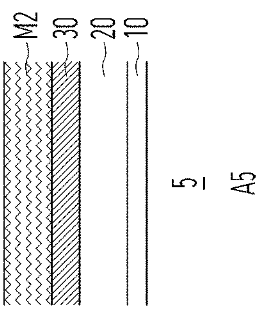
M2
30
20
10
5
A5
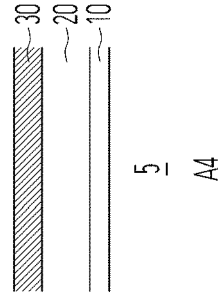
30
20
10
5
A4
FIG. 6
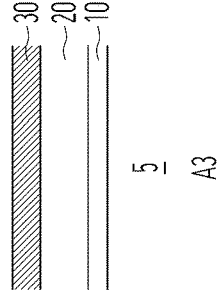
30
20
10
5
A3
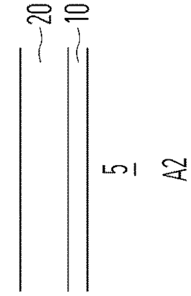
20
10
5
A2
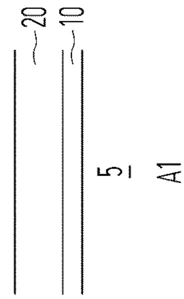
20
10
5
A1

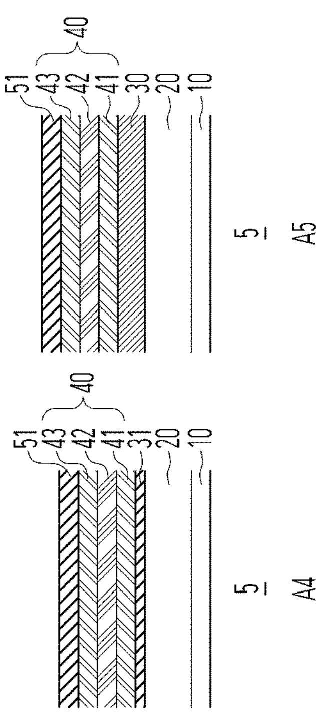
FIG. 11
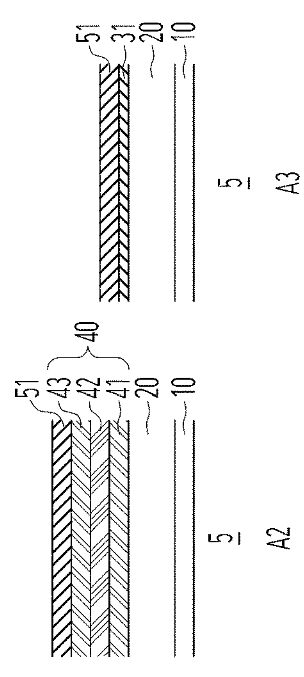
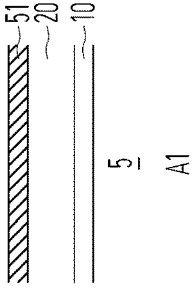

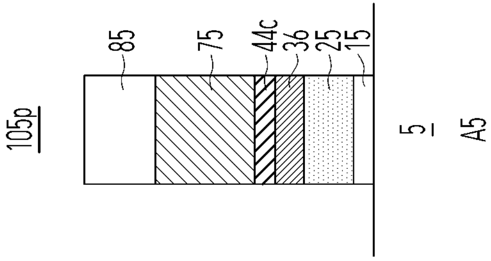
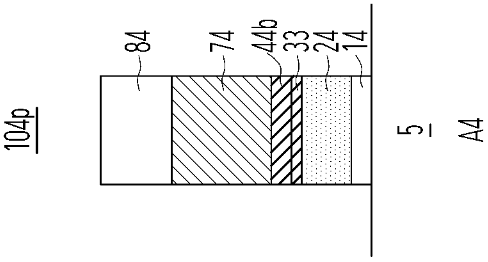
FIG. 17
103p
83
73
32
23
13
5
A3
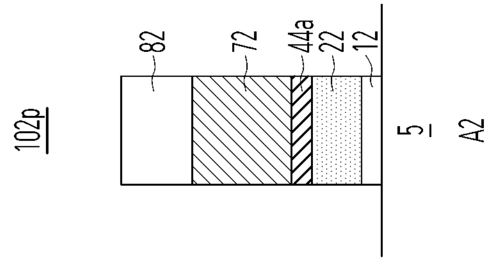
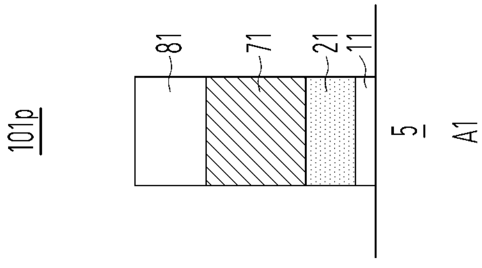

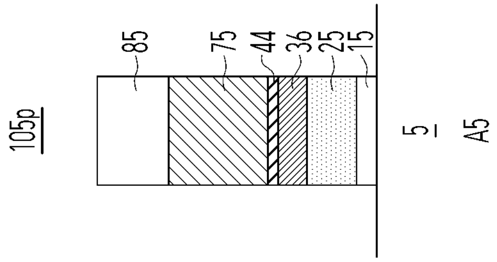
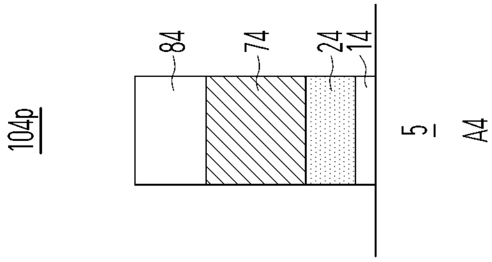
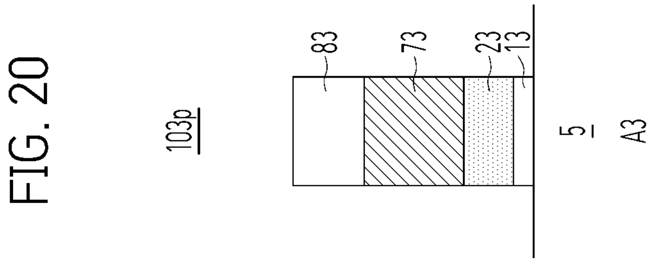
FIG. 20
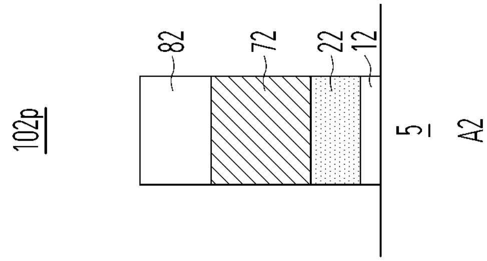
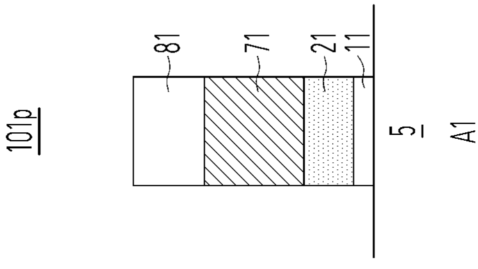

SEMICONDUCTOR DEVICE HAVING HIGH-K GATE DIELECTRIC LAYERS

CROSS-REFERENCE TO RELATED APPLICATION

The present application claims priority under 35 U.S.C. § 119 to Korean Patent Application No. 10-2023-0047927, filed on Apr. 12, 2023, which is incorporated herein by reference in its entirety.

BACKGROUND

1. Field

Embodiments of the present disclosure relate to semiconductor devices including gate structures having high-k gate dielectric layers and methods of manufacturing the semiconductor devices.

2. Description of the Related Art

As semiconductor devices become highly integrated, a gate structure having a high-k gate dielectric layer has been proposed.

SUMMARY

An embodiment of the present disclosure provides a semiconductor device including a first gate structure including a first N-type high-k gate dielectric layer disposed in a first area over a substrate, a second gate structure comprising a first P-type high-k gate dielectric layer disposed in a second area over the substrate, a third gate structure including a second N-type high-k gate dielectric layer disposed in a third area over the substrate, and a fourth gate structure including a second P-type high-k gate dielectric layer disposed in a fourth area over the substrate. The first N-type high-k gate dielectric layer includes an N-type dipole material with a first concentration. The first P-type high-k gate dielectric layer includes a P-type dipole material with a second concentration. The second N-type high-k gate dielectric layer includes the N-type dipole material with a third concentration. The second P-type high-k gate dielectric layer includes the P-type dipole material with a fourth concentration. The first concentration is higher than the third concentration, and the second concentration is higher than the fourth concentration.

An embodiment of the present disclosure provides a method of manufacturing a semiconductor device including preparing a substrate, the substrate has a first area, a second area, a third area, and a fourth area, entirely forming an interfacial insulating layer over the substrate; forming a high-k gate dielectric layer over the interfacial insulating layer; forming a buffer titanium nitride layer over the high-k gate dielectric layer; removing the buffer titanium nitride layer in the first area and the second area; entirely forming a P-type dipole material layer; removing the P-type dipole material layer from the first area and the third area; entirely forming an N-type dipole material layer; removing the N-type dipole material layer in the second area and the fourth area; and diffusing an N-type dipole material in the N-type dipole material layer into the high-k gate dielectric layer in the first and third areas and diffusing a P-type dipole material in the P-type dipole material layer into the high-k gate dielectric layer in the second and fourth areas by performing an annealing process.

An embodiment of the present disclosure provides a method of manufacturing a semiconductor device including preparing a substrate, the substrate has a first area, a second area, a third area, and a fourth area; forming an interfacial insulating layer over the substrate in the first to fourth areas; forming a high-k gate dielectric layer over the interfacial insulating layer in the first to fourth areas; forming a buffer titanium nitride layer over the high-k gate dielectric layer in the third area and the fourth area; forming an N-type dipole material layer over the high-k gate dielectric layer in the first area and over the buffer titanium nitride layer in the third area; forming a P-type dipole material layer over the high-k gate dielectric layer in the second area and over the buffer titanium nitride layer in the fourth area; diffusing an N-type dipole material in the N-type dipole material layer and a P-type dipole material in the P-type dipole material layer into the high-k gate dielectric layer by performing an annealing process.

BRIEF DESCRIPTION OF THE DRAWINGS

FIGS. 1A to 1D are cross-sectional views schematically illustrating gate structures of a semiconductor device according to embodiments of the present disclosure.

FIGS. 2 to 17 are cross-sectional views illustrating a method of manufacturing a semiconductor device according to an embodiment of the present invention.

FIGS. 18 to 20 are cross-sectional views illustrating a method of manufacturing a semiconductor device according to another embodiment of the present invention.

DETAILED DESCRIPTION

Figure 1A:
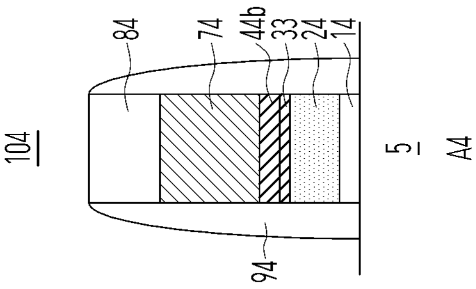
Figure 1A:
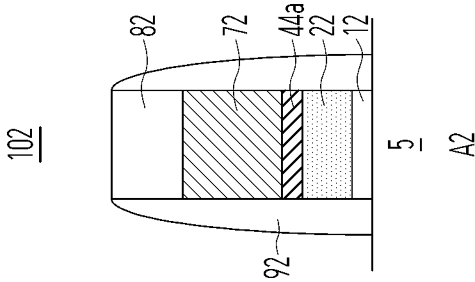
Figure 1A:
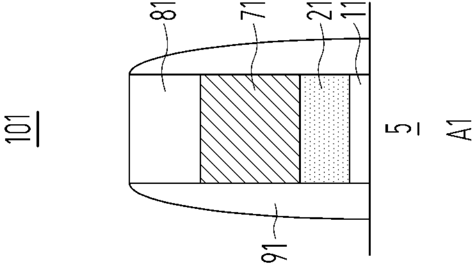

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that describe the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present disclosure provide high-k gate dielectric layers (i.e., high-k gate insulating layers)

having various dipole materials and various dipole material concentrations, and methods of manufacturing the gate dielectric layers.

Embodiments of the present disclosure provide gate structures including high-k gate dielectric layers and methods of manufacturing the gate structures.

Embodiments of the present disclosure provide semiconductor devices including gate structures and methods of manufacturing the semiconductor devices.

FIGS. 1A and 1B are longitudinal cross-sectional views schematically illustrating gate structures 101 to 105 of a semiconductor device according to embodiments of the present disclosure. Referring to FIGS. 1A and 1B, the semiconductor device may include the gate structures 101 to 105. Specifically, the semiconductor device may include a first gate structure 101 disposed in the first area A1, a second gate structure 102 disposed in a second area A2, a third gate structure 103 disposed in a third area A3, a fourth gate structure 104 disposed in a fourth area A4, and a gate structure 105 disposed in a fifth area A5.

Referring to FIG. 1A, first NMOS transistors having a first N-channel threshold voltage may be disposed in the first area A1, first PMOS transistors having a first P-channel threshold voltage may be disposed in the second area A2, second NMOS transistors having a second N-channel threshold voltage may be disposed the third area A3, second PMOS transistors having a second P-channel threshold voltage may be disposed in the fourth area A4, and third NMOS transistors having a third N-channel threshold voltage may be disposed in the fifth area A5. Accordingly, the first gate structure 101 may be a first NMOS gate structure, the second gate structure 102 may be a first PMOS gate structure, the third gate structure 103 may be a second NMOS gate structure, the fourth gate structure 104 may be a second PMOS gate structure, and the fifth gate structure 105 may be a third NMOS gate structure. The first N-channel threshold voltage may be lower than the second N-channel threshold voltage. The first P-channel threshold voltage may be lower than the second P-channel threshold voltage. The third N-channel threshold voltage may be lower than the second N-channel threshold voltage. In an embodiment, the third N-channel threshold voltage may be higher than the second N-channel threshold voltage. In an embodiment, the third N-channel threshold voltage may be higher than the first N-channel threshold voltage.

The first gate structure 101 in the first area A1 may include a first interfacial insulating layer 11 disposed on a substrate 5, a first N-type high-k gate dielectric layer 21 disposed on the first interfacial insulating layer 11, a first gate electrode 71 disposed on the first N-type high-k gate dielectric layer 21, a first gate capping layer 81 disposed on the first gate electrode 71, and first gate spacers 91 disposed on sidewalls of the first interfacial insulating layer 11, the first N-type high-k gate dielectric layer 21, the first gate electrode 71, and the first gate capping layer 81.

The second gate structure 102 in the second area A2 may include a second interfacial insulating layer 12 disposed on the substrate 5, a first P-type high-k gate dielectric layer 22 disposed on the second interfacial insulating layer 12, a first P-type dipole doped metal layer 44*a* disposed on the first P-type high-k gate dielectric layer 22, a second gate electrode 72 disposed on the first P-type dipole doped metal layer 44*a*, a second gate capping layer 82 disposed on the second gate electrode 72, and second gate spacers 92 disposed on sidewalls of the second interfacial insulating layer 12, the first P-type high-k gate dielectric layer 22, the first P-type dipole doped metal layer 44*a*, the second gate electrode 72, and the second gate capping layer 82.

The third gate structure 103 in the third area A3 may include a third interfacial insulating layer 13 disposed on the substrate 5, a second N-type high-k gate dielectric layer 23 disposed on the third interfacial insulating layer 13, an N-type dipole doped titanium nitride layer 32 disposed on the second N-type high-k gate dielectric layer 23, a third gate electrode 73 disposed on the N-type dipole doped titanium nitride layer 32, a third gate capping layer 83 disposed on the third gate electrode 73, and third gate spacers 93 disposed on sidewalls of the third interfacial insulating layer 13, the second N-type high-k gate dielectric layer 23, the N-type dipole doped titanium nitride layer 32, the third gate electrode 73, and the third gate capping layer 83.

The fourth gate structure 104 in the fourth area A4 may include a fourth interfacial insulating layer 14 disposed on the substrate 5, a second P-type high-k gate dielectric layer 24 disposed on the fourth interfacial insulating layer 14, a P-type dipole doped titanium nitride layer 33 disposed on the second P-type high-k gate dielectric layer 24, a second P-type dipole doped metal layer 44*b* disposed on the P-type dipole doped titanium nitride layer 33, a fourth gate electrode 74 disposed on the second P-type dipole doped metal layer 44*b*, a fourth gate capping layer 84 disposed on the fourth gate electrode 74, and fourth gate spacers 94 disposed on sidewalls of the fourth interfacial insulating layer 14, the second P-type high-k gate dielectric layer 24, the P-type dipole doped titanium nitride layer 33, the second P-type dipole doped metal layer 44*b*, the fourth gate electrode 74, and the fourth gate capping layer 84.

The fifth gate structure 105 in the fifth area A5 may include a fifth interfacial insulating layer 15 disposed on the substrate 5, an undoped high-k gate dielectric layer 25 disposed on the fifth interfacial insulating layer 15, a buffer metal layer 36 disposed on the undoped high-k gate dielectric layer 25, a third P-type dipole doped metal layer 44*c* disposed on the buffer metal layer 36, a fifth gate electrode 75 disposed on the third P-type dipole metal layer 44*c*, a fifth gate capping layer 85 disposed on the fifth gate electrode 75, and fifth gate spacers 95 disposed on sidewalls of the fifth interfacial insulating layer 15, the undoped high-k gate dielectric layer 25, the buffer metal layer 36, the third P-type dipole metal layer 44*c*, the fifth gate electrode 75, and the fifth gate capping layer 85.

Each of the first to fifth interfacial insulating layers 11 to 15 may include an oxidized silicon layer or an oxidized silicon germanium layer. For example, the first to fifth interfacial insulating layers 11 to 15 may be formed by oxidizing a surface of the substrate 5.

The first N-type high-k gate dielectric layer 21 may include a metal such as hafnium (Hf) or zirconium (Zr), an N-type dipole material, and oxygen (O). The N-type dipole material may include lanthanum (La). For example, the first N-type high-k gate dielectric layer 21 may include hafnium lanthanum oxide (HfLaO). In another embodiment, the first N-type high-k gate dielectric layer 21 may further include nitrogen N. For example, the first N-type high-k gate dielectric layer 21 may include hafnium lanthanum oxy-nitride (HfLaON).

The first P-type high-k gate dielectric layer 22 may include a metal such as hafnium (Hf) or zirconium (Zr), a P-type dipole material, and oxygen (O). The P-type dipole material may include aluminum (Al). For example, the first P-type high-k gate dielectric layer 22 may include hafnium aluminum oxide (HfAlO). In another embodiment, the first P-type high-k gate dielectric layer 22 may further include nitrogen N. For example, the first P-type high-k gate dielectric layer 22 may include hafnium aluminum oxy-nitride (HfAlON).

The second N-type high-k gate dielectric layer 23 may include a metal such as hafnium (Hf) or zirconium (Zr), an N-type dipole material, and oxygen (O). The N-type dipole material may include lanthanum (La). For example, the second N-type high-k gate dielectric layer 23 may include hafnium lanthanum oxide (HfLaO). In another embodiment, the second N-type high-k gate dielectric layer 23 may further include nitrogen N. For example, the second N-type high-k gate dielectric layer 23 may include hafnium lanthanum oxy-nitride (HfLaON).

The second P-type high-k gate dielectric layer 24 may include a metal such as hafnium (Hf) or zirconium (Zr), a P-type dipole material, and oxygen (O). The P-type dipole material may include aluminum (Al). For example, the second P-type high-k gate dielectric layer 24 may include hafnium aluminum oxide (HfAlO). In another embodiment, the second P-type high-k gate dielectric layer 24 may further include nitrogen N. For example, the second P-type high-k gate dielectric layer 24 may include hafnium aluminum oxy-nitride (HfAlON).

The undoped high-k gate dielectric layer 25 may include metal and oxygen (O) such as hafnium (Hf) or zirconium (Zr). The undoped high-k gate dielectric layer 25 might not include an N-type dipole material and a P-type dipole material. In another embodiment, the undoped high-k gate dielectric layer 25 may include a very low concentration of the N-type dipole material and/or a very low concentration of the P-type dipole material.

A concentration of the N-type dipole material in the first N-type high-k gate dielectric layer 21 may be higher than a concentration of the N-type dipole material in the second N-type high-k gate dielectric layer 23. A concentration of the P-type dipole material in the first P-type high-k gate dielectric layer 22 may be higher than a concentration of the P-type dipole material in the second P-type high-k gate dielectric layer 24. A concentration of the N-type dipole material in the undoped high-k gate dielectric layer 25 may be lower than the concentration of the N-type dipole material in the second N-type high-k gate dielectric layer 23. A concentration of the P-type dipole material in the undoped high-k gate dielectric layer 25 may be lower than the concentration of the P-type dipole material in the second P-type high-k gate dielectric layer 24.

The first to fifth gate electrodes 71 to 75 may include multi-layered material layers. For example, each of the first to fifth gate electrodes 71 to 75 may include a work function adjusting layer, a barrier metal layer, and a gate electrode material layer. Specifically, the work function adjusting layer may include a titanium nitride (TiN) layer and/or a doped silicon (Si) layer. The barrier metal layer may include a titanium nitride (TiN) layer or a tantalum nitride (TaN) layer. Each of the first to fifth gate electrodes may include a metal such as tungsten (W) or a metal compound such as titanium nitride (TiN). Each of the first to fifth gate capping layers 81 to 85 and the first to fifth gate spacers 91 to 95 may contain a silicon nitride (SiN)-based insulating material.

In the second area A2, the first P-type dipole doped metal layer 44*a* may include titanium (Ti), the P-type dipole material, and nitrogen (N). The P-type dipole material may include aluminum (Al). For example, the first P-type dipole doped metal layer 44*a* may include titanium aluminum nitride (TiAlN).

In the third area A3, the N-type dipole doped titanium nitride layer 32 may include titanium (Ti), the N-type dipole material, and nitrogen (N). The N-type dipole material may include lanthanum (La). For example, the N-type dipole doped titanium nitride layer 32 may include a titanium lanthanum compound such as titanium lanthanum nitride (TiLaN).

In the fourth area A4, the P-type dipole doped titanium nitride layer 33 may include titanium (Ti), a P-type dipole material, and nitrogen (N). For example, the P-type dipole doped titanium nitride layer 33 may include titanium aluminum nitride (TiAlN). In the fourth area A4, the second P-type dipole doped metal layer 44*b* may include titanium aluminum nitride (TiAlN).

In the fifth area A5, the buffer metal layer 36 may include titanium nitride (TiN). In another embodiment, the buffer metal layer 36 may further include a very low concentration of the P-type dipole material. For example, the buffer metal layer 36 may include titanium aluminum nitride (TiAlN) including aluminum (Al) with a very low concentration. In the fifth area A5, the third P-type dipole doped metal layer 44*c* may include titanium aluminum nitride (TiAlN). In another embodiment, the third P-type dipole doped metal layer 44*c* may include titanium aluminum (TiAl).

In one embodiment, because the first N-type high-k gate dielectric layer 21 of the first gate structure 101 in the first area A1 includes the highly doped N-type dipole material, the first gate structure 101 can have a first N-channel threshold voltage at a low level.

In one embodiment, because the first P-type high-k gate dielectric layer 22 of the second gate structure 102 in the second area A2 includes a highly doped P-type dipole material, the second gate structure 102 can have a first P-channel threshold voltage at a low level.

In one embodiment, because the second N-type high-k gate dielectric layer 23 of the third gate structure 103 in the third area A3 includes a low doped N-type dipole material, the third gate structure 103 can have a second N-channel threshold voltage at an intermediate level higher than the low level of the first N-channel threshold voltage.

In one embodiment, because the second P-type high-k gate dielectric layer 24 of the fourth gate structure 104 in the fourth area A4 includes a low doped P-type dipole material, the fourth gate structure 104 can have a second P-channel threshold voltage with an intermediate level higher than the low level of the first P-channel threshold voltage.

Referring to FIG. 1B, some elements in FIG. 1A may be selectively omitted.

Figure 1C:
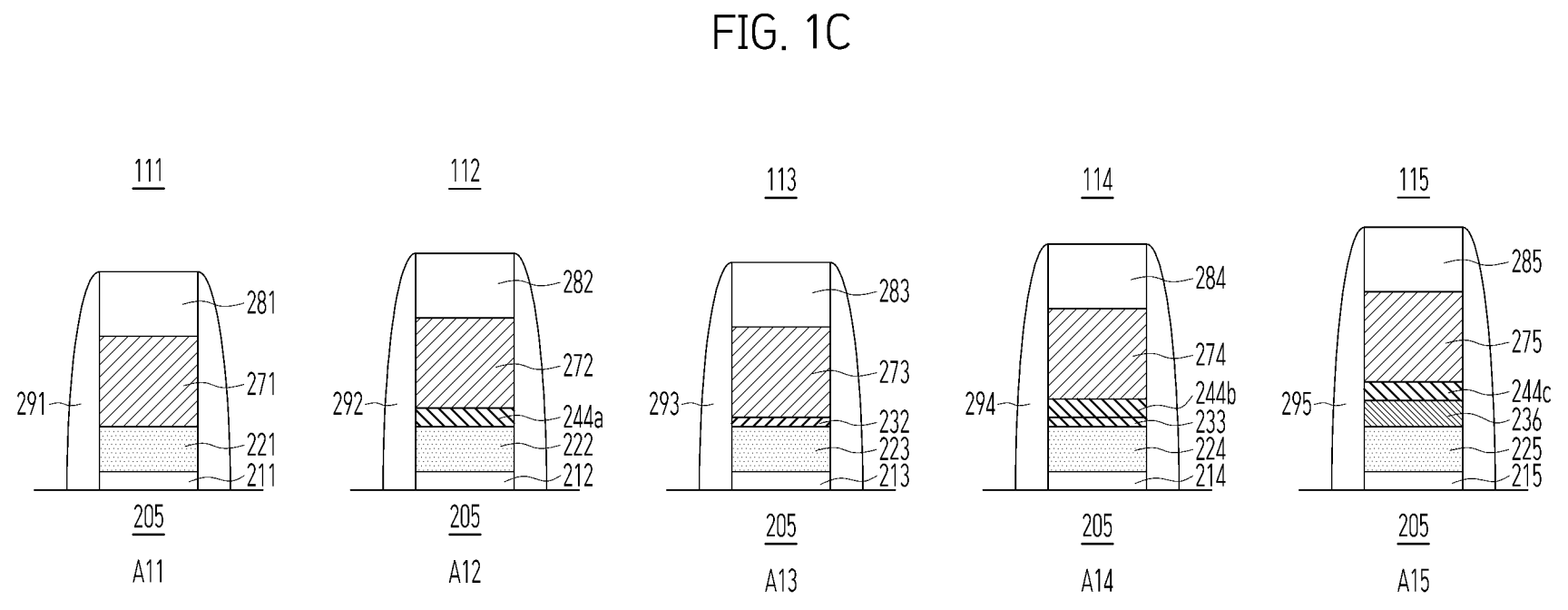

Referring to FIG. 1C, a first PMOS transistor 111 having a first P-channel threshold voltage may be disposed in a first area A11, a first NMOS transistor 112 having a first N-channel threshold voltage may be disposed in a second area A12, a second PMOS transistor 113 having a second P-channel threshold voltage may be disposed in a third area A13, a second NMOS transistor 114 having a second N-channel threshold voltage may be disposed in a fourth area A14, and a third PMOS transistor 115 having a third P-channel threshold voltage may be disposed in a fifth area A15. Accordingly, the first gate structure 111 may be a first PMOS gate structure, the second gate structure 112 may be a first NMOS gate structure, the third gate structure 113 may be a second PMOS gate structure, the fourth gate structure 114 may be a second NMOS gate structure, and the fifth gate structure 115 may be a third PMOS gate structure. The first P-channel threshold voltage may be lower than the second P-channel threshold voltage. The first N-channel threshold voltage may be lower than the second N-channel threshold voltage. The third P-channel threshold voltage may be lower than the second P-channel threshold voltage. In an embodiment, the third P-channel threshold voltage may be higher than the second P-channel threshold voltage. In an embodiment, the third P-channel threshold voltage may be higher than the first P-channel threshold voltage.

The first gate structure 111 in the first area A11 may include a first interfacial insulating layer 211 disposed on a substrate 205, a first P-type high-k gate dielectric layer 221 disposed on the first interfacial insulating layer 211, a first gate electrode 271 disposed on the first P-type high-k gate dielectric layer 221, a first gate capping layer 281 disposed on the first gate electrode 271, and first gate spacers 291 disposed on sidewalls of the first interfacial insulating layer 211, the first P-type high-k gate dielectric layer 221, the first gate electrode 271, and the first gate capping layer 281.

The second gate structure 112 in the second area A12 may include a second interfacial insulating layer 212 disposed on the substrate 205, a first N-type high-k gate dielectric layer 222 disposed on the second interfacial insulating layer 212, a second gate electrode 272 disposed on the first N-type high-k gate dielectric layer 222, a second gate capping layer 282 disposed on the second gate electrode 272, and second gate spacers 292 disposed on sidewalls of the second interfacial insulating layer 212, the first N-type high-k gate dielectric layer 222, the second gate electrode 272, and the second gate capping layer 282.

The third gate structure 113 in the third area A13 may include a third interfacial insulating layer 213 disposed on the substrate 205, a second P-type high-k gate dielectric layer 223 disposed on the third interfacial insulating layer 213, a third gate electrode 273 disposed on the second P-type high-k gate dielectric layer 223, a third gate capping layer 283 disposed on the third gate electrode 273, and third gate spacers 293 disposed on sidewalls of the third interfacial insulating layer 213, the second P-type high-k gate dielectric layer 223, the third gate electrode 273, and the third gate capping layer 283.

The fourth gate structure 114 may include a fourth interfacial insulating layer 214 disposed on the substrate 205, a second N-type high-k gate dielectric layer 224 disposed on the fourth interfacial insulating layer 214, a fourth gate electrode 274 disposed on the second N-type high-k gate dielectric layer 224, a fourth gate capping layer 284 disposed on the fourth gate electrode 274, and fourth gate spacers 294 disposed on sidewalls of the fourth interfacial insulating layer 214, the second N-type high-k gate dielectric layer 224, the fourth gate electrode 274, and the fourth gate capping layer 284.

The fifth gate structure 115 in the fifth area A15 may include a fifth interfacial insulating layer 215 disposed on the substrate 205, an undoped high-k gate dielectric layer 225 disposed on the fifth interfacial insulating layer 215, a fifth gate electrode 275 disposed on the undoped high-k gate dielectric layer 225, a fifth gate capping layer 285 disposed on the fifth gate electrode 275, and fifth gate spacers 295 disposed on sidewalls of the fifth interfacial insulating layer 215, the undoped high-k gate dielectric layer 225, the fifth gate electrode 275, and the fifth gate capping layer 285.

The first P-type high-k gate dielectric layer 221 may include a metal such as hafnium (Hf) or zirconium (Zr), a P-type dipole material, and oxygen (O). The P-type dipole material may include aluminum (Al). For example, the first P-type high-k gate dielectric layer 221 may include hafnium aluminum oxide (HfAlO). In another embodiment, the first P-type high-k gate dielectric layer 221 may further include nitrogen N. For example, the first P-type high-k gate dielectric layer 221 may include hafnium aluminum oxy-nitride (HfAlON).

The first N-type high-k gate dielectric layer 222 may include a metal such as hafnium (Hf) or zirconium (Zr), an N-type dipole material, and oxygen (O). The N-type dipole material may include lanthanum (La). For example, the first N-type high-k gate dielectric layer 222 may include hafnium lanthanum oxide (HfLaO). In another embodiment, the first N-type high-k gate dielectric layer 222 may further include nitrogen N. For example, the first N-type high-k gate dielectric layer 222 may include hafnium lanthanum oxy-nitride (HfLaON).

The second P-type high-k gate dielectric layer 223 may include a metal such as hafnium (Hf) or zirconium (Zr), the P-type dipole material, and oxygen (O). The P-type dipole material may include aluminum (Al). For example, the second P-type high-k gate dielectric layer 223 may include hafnium aluminum oxide (HfAlO). In another embodiment, the second P-type high-k gate dielectric layer 223 may further include nitrogen N. For example, the second P-type high-k gate dielectric layer 223 may include hafnium aluminum oxy-nitride (HfAlON).

The second N-type high-k gate dielectric layer 224 may include a metal such as hafnium (Hf) or zirconium (Zr), the N-type dipole material, and oxygen (O). The N-type dipole material may include lanthanum (La). For example, the second N-type high-k gate dielectric layer 224 may include hafnium lanthanum oxide (HfLaO). In another embodiment, the second N-type high-k gate dielectric layer 224 may further include nitrogen N. For example, the second N-type high-k gate dielectric layer 224 may include hafnium lanthanum oxy-nitride (HfLaON).

The undoped high-k gate dielectric layer 225 may include metal such as hafnium (Hf) or zirconium (Zr), and oxygen (O). The undoped high-k gate dielectric layer 225 might not include the N-type dipole material and the P-type dipole material. In another embodiment, the undoped high-k gate dielectric layer 225 may include the N-type dipole material with a very low concentration and/or the P-type dipole material with a very low concentration. A concentration of the P-type dipole material in the first P-type high-k gate dielectric layer 221 may be higher than a concentration of the P-type dipole material in the second P-type high-k gate dielectric layer 223. A concentration of the N-type dipole material in the first N-type high-k gate dielectric layer 222 may be higher than a concentration of the N-type dipole material in the second N-type high-k gate dielectric layer 224. A concentration of the P-type dipole material in the undoped high-k gate dielectric layer 225 may be lower than the concentration of the P-type dipole material in the second P-type high-k gate dielectric layer 223. A concentration of the N-type dipole material in the undoped high-k gate dielectric layer 225 may be lower than the concentration of the N-type dipole material in the second N-type high-k gate dielectric layer 224.

In the second area A12, the first N-type dipole doped metal layer **244*a* may include titanium (Ti), the N-type dipole material, and nitrogen (N). The N-type dipole material may include lanthanum (La). For example, the first N-type dipole doped metal layer 244*a*** may include a titanium lanthanum compound such as titanium lanthanum nitride (TiLaN).

In the third area A13, the P-type dipole doped titanium nitride layer 232 may include titanium (Ti), the P-type dipole material, and nitrogen (N). The P-type dipole material may include aluminum (Al). For example, the P-type dipole doped titanium nitride layer 232 may include titanium aluminum nitride (TiAlN).

In the fourth area A14, the N-type dipole doped titanium nitride layer 233 may include titanium (Ti), the N-type dipole material, and nitrogen (N). For example, the N-type dipole doped titanium nitride layer 233 may include a titanium lanthanum compound such as titanium lanthanum nitride (TiLaN). In the fourth area A14, the second N-type dipole doped metal layer 244*b* may include a titanium lanthanum compound such as titanium lanthanum nitride (TiLaN).

In the fifth area A15, the buffer metal layer 236 may include titanium nitride (TiN). In another embodiment, the buffer metal layer 236 may further include the N-type dipole material with a very low concentration. For example, the buffer metal layer 236 may include titanium lanthanum compounds such as titanium lanthanum nitride (TiLaN) including lanthanum (La) with a very low concentration. In the fifth area A15, the third N-type dipole doped metal layer 44*c* may include titanium lanthanum nitride (TiAlN). In another embodiment, the third N-type dipole doped metal layer 244*c* may include a titanium lanthanum compound such as titanium lanthanum (TiLa) or titanium lanthanum nitride (TiLaN). The third P-type dipole doped metal layer 244*c* shown in FIG. 1C may correspond to a P-type dipole doped metal layer 244 shown in FIG. 1D. In embodiments described with reference to FIGS. 1A to 1D, the P-type elements and the N-type elements may be compatible with each other.

In one embodiment, because the first P-type high-k gate dielectric layer 221 of the first gate structure 111 in the first area A11 includes a highly doped P-type dipole material, the first gate structure 111 can have a first P-channel threshold voltage at a lower level.

In one embodiment, because the first N-type high-k gate dielectric layer 222 of the second gate structure 112 in the second area A12 includes a highly doped N-type dipole material, the second gate structure 112 can have a first N-channel threshold voltage at a low level.

In one embodiment, because the second P-type high-k gate dielectric layer 223 of the third gate structure 113 of the third area A13 includes a low doped P-type dipole material, the third gate structure 113 can have the second P-channel threshold voltage at an intermediate level higher than the low level of the first P-channel threshold voltage.

In one embodiment, because the second N-type high-k gate dielectric layer 224 of the fourth gate structure 114 in the fourth area A14 includes a low doped N-type dipole material, the fourth gate structure 114 can have a second N-channel threshold voltage with an intermediate level higher than the low level of the first N-channel threshold voltage.

Referring to FIG. 1D, some elements in FIG. 1C may be selectively omitted.

Figure 2:
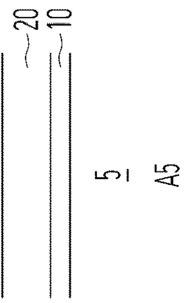
Figure 2:
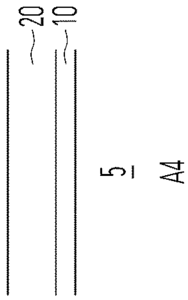
Figure 2:
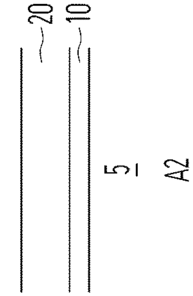
Figure 2:
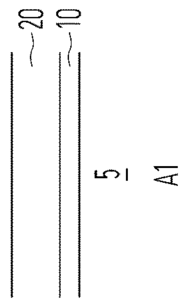

FIGS. 2 to 17 are longitudinal cross-sectional views illustrating a method of manufacturing a semiconductor device (e.g., corresponding to FIGS. 1A and 1B) according to an embodiment of the present invention. Referring to FIG. 2, the method may include forming an interfacial insulating layer 10 and a high-k gate dielectric layer 20 on a substrate 5. The substrate 5 may include a first area A1, a second area A2, a third area A3, a fourth area A4, and a fifth area A5. In an embodiment, the first area A1 may be a first NMOS transistor area, the second area A2 may be a first PMOS transistor area, the third area A3 may be a second NMOS transistor area, and the fourth area A4 may be a second PMOS transistor area, and the fifth area A5 may be a third NMOS transistor area.

The substrate 5 may include one of a silicon (Si) wafer, a silicon germanium (SiGe) wafer, an epitaxial grown silicon (Si) layer, an epitaxial grown silicon germanium (SiGe) layer, or a silicon on insulator (SOI).

The forming the interfacial insulating layer 10 may include oxidizing a surface of the substrate 5 by performing an oxidation process.

The forming the high-k gate dielectric layer 20 may include performing a deposition process such as CVD (chemical vapor deposition) to form a metal oxide layer including at least one of hafnium (Hf), zirconium (Zr), and other metals on the interfacial insulating layer 10. In an embodiment, the high-k gate dielectric layer 20 may include at least one of hafnium oxide (HfO), zirconium oxide (ZrO), and other metal oxides.

The method may further include nitriding the high-k gate dielectric layers 20 by performing a nitriding process. For example, the method may further include injecting nitrogen ions into the high-k gate dielectric layer 20 by performing one of a thermal nitriding process, a plasma nitriding process, or a plasma nitriding annealing process. Nitrogen ions may be distributed in the high-k gate dielectric layer 20 to have a concentration gradient overall by performing the thermal nitriding process, and nitrogen ions may have a higher concentration gradient as they are closer to the surface of the high-k gate dielectric layer 20 by performing the plasma nitriding process. In an embodiment, the high-k gate dielectric layer 20 may include a hafnium oxy-nitride (HfON) layer, a zirconium oxy-nitride (ZrON) layer, or an oxy-nitride materials including at least one of various metals. Nitrogen ions injected into the high-k gate dielectric layer 20 may increase a k-value, that is, a dielectric constant, of the high-k gate dielectric layer 20.

Figure 3:
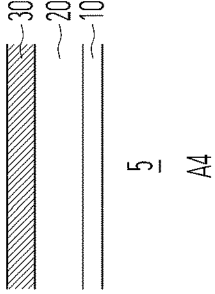
Figure 3:
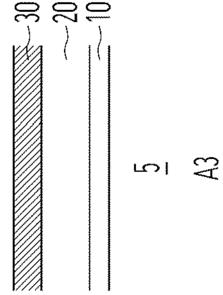
Figure 3:
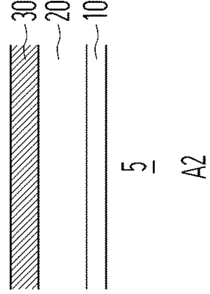
Figure 3:
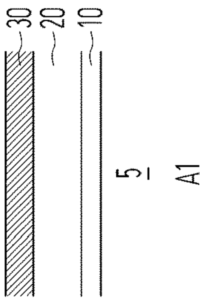

Referring to FIG. 3, the method may further include forming a buffer titanium nitride layer 30 on the high-k gate dielectric layer 20 by performing a deposition process. The buffer titanium nitride layer 30 may have a lower region and an upper region. The lower region of the buffer titanium nitride layer 30 may be formed to be adjacent to the interfacial insulating layer 10. The upper region may be spaced apart from the interfacial insulating layer 10 and be close to an upper surface of the buffer titanium nitride layer 30. A titanium (Ti) concentration may be higher than a nitrogen (N) concentration in the lower region of the buffer titanium nitride layer 30. The titanium (Ti) concentration and the nitrogen (N) concentration may be similar to each other in the upper region of the buffer titanium nitride layer 30. For example, the lower region of the buffer titanium nitride layer 30 may include a titanium-rich titanium nitride (TiN) layer with a higher titanium (Ti) concentration than titanium nitride (TIN) according to the Law of Definite Proportions, and the upper region of the buffer titanium nitride layer 30 may include a titanium nitride (TiN) layer with substantially the same titanium (Ti) concentration in titanium nitride (TiN) according to the Law of Definite Proportions. Accordingly, the lower region and the upper region of the buffer titanium nitride layer 30 may have an etching selectivity to each other. Titanium (Ti) atoms may have a concentration gradient in the buffer titanium nitride layer 30.

Figure 4:
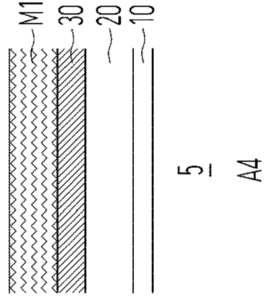
Figure 4:
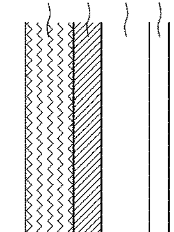
Figure 4:
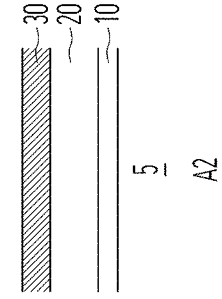
Figure 4:
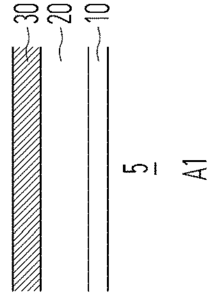

Referring to FIG. 4, the method may further include forming a first mask pattern M1 exposing the first area A1 and the second area A2 and covering the third area A3, the fourth area A4, and the fifth area A5. The forming the first mask pattern M1 may include performing a photolithography process and a development process. For example, the first mask pattern M1 may include a photoresist. In another embodiment, the first mask pattern M1 may include an inorganic material such as silicon nitride or silicon oxide.

Figure 5:
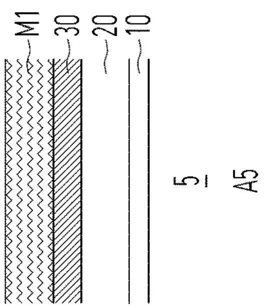
Figure 5:
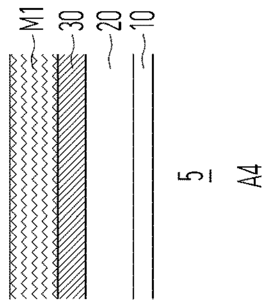
Figure 5:
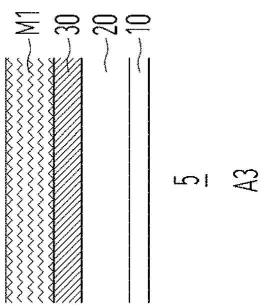
Figure 5:
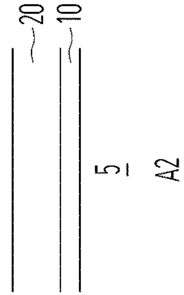
Figure 5:
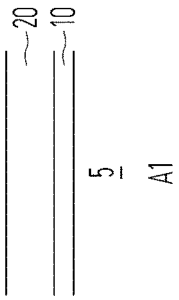

Referring to FIG. 5, the method may further include removing the buffer titanium nitride layer 30 exposed in the first area A1 and the second area A2 by performing an etching process. The high-k gate dielectric layer 20 may be exposed in the first area A1 and the second area A2.

Referring to FIG. 6, the method may further include removing the first mask pattern M1, and forming a second mask pattern M2 exposing the first area A1, the second area A2, the third area A3, and the fourth area A4, and covering the fifth area A5. The second mask pattern M2 may be formed by performing a photolithography process and a development process. The second mask pattern M2 may include the same material as the first mask pattern M1. The buffer titanium nitride layer 30 may be exposed in the third area A3 and the fourth area A4.

Figure 7:
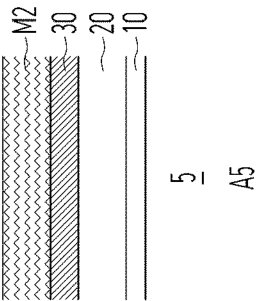
Figure 7:
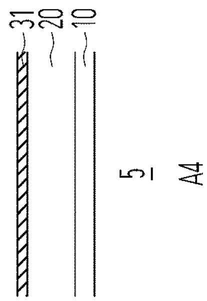
Figure 7:
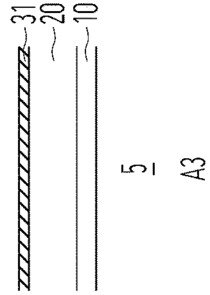
Figure 7:
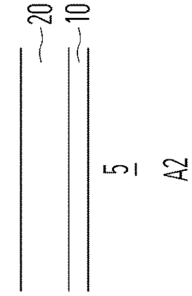
Figure 7:
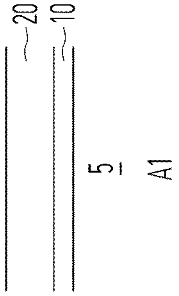

Referring to FIG. 7, the method may further include thinning the buffer titanium nitride layer 30 exposed in the third area A3 and the fourth area A4. That is, the buffer titanium nitride layer 30 exposed in the third area A3 and the fourth area A4 may be partially removed. For example, the upper region of the buffer titanium nitride layer 30 may be removed. As mentioned above, the lower region of the buffer titanium nitride layer 30 may include titanium (Ti) more than the upper region of the buffer titanium nitride layer 30. Accordingly, the lower region of the buffer titanium nitride layer 30 may have better etching resistance than the upper region of the buffer titanium nitride layer 30. Accordingly, although the upper area of the buffer titanium nitride layer 30 may be removed by an etching process, and the lower area of the buffer titanium nitride layer 30 may remain. That is, the buffer titanium nitride layer 30 may be thinned into a buffer titanium-rich titanium nitride layer 31. Thereafter, the second mask pattern M2 may be removed.

Figure 8:
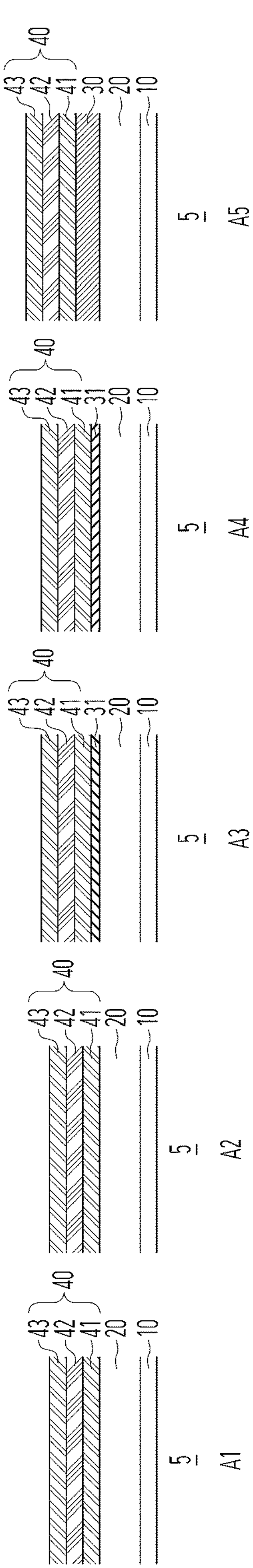

Referring to FIG. 8, the method may further include entirely forming a dipole stack 40. That is, the dipole stack 40 may be formed on the high-k gate dielectric layer 20 exposed in the first area A1 and the second area A2, on the buffer titanium-rich titanium nitride layer 31 exposed in the third are A3 and the fourth area A4, and on the buffer titanium nitride layer 30 exposed in the fifth area A5. The dipole stack 40 may include a lower metal layer 41, a P-type dipole material layer 42, and an upper metal layer 43. In an embodiment, the lower metal layer 41 may include a titanium nitride layer. The P-type dipole material layer 42 may include a P-type dipole material such as aluminum (Al). The upper metal layer 43 may include a titanium nitride layer.

Figure 9:
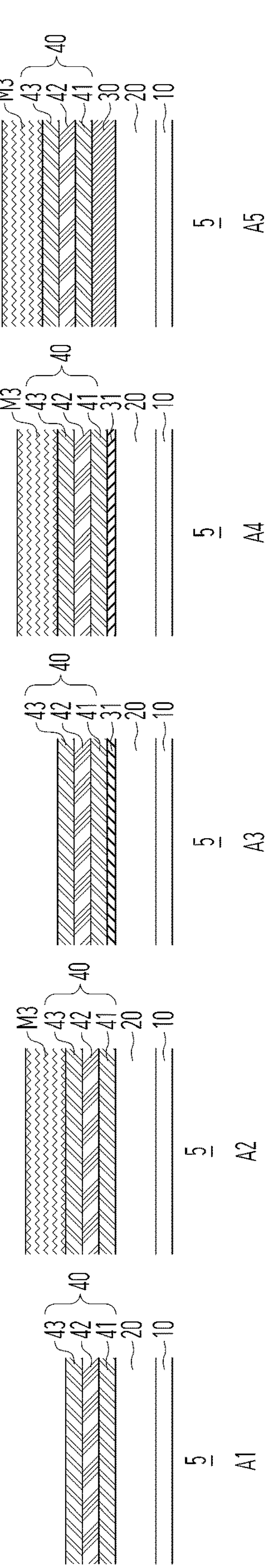

Referring to FIG. 9, the method may further include forming a third mask pattern M3 exposing the first area A1 and the third area A3, and covering the second area A2, the fourth area A4, and the fifth area A5. The third mask pattern M3 may be formed by performing a photolithography process and a development process. The third mask pattern M3 may include the same material as the first or second mask patterns M1 or M2. The upper metal layer 43 of the dipole stack 40 may be exposed in the first area A1 and the third area A3.

Figure 10:
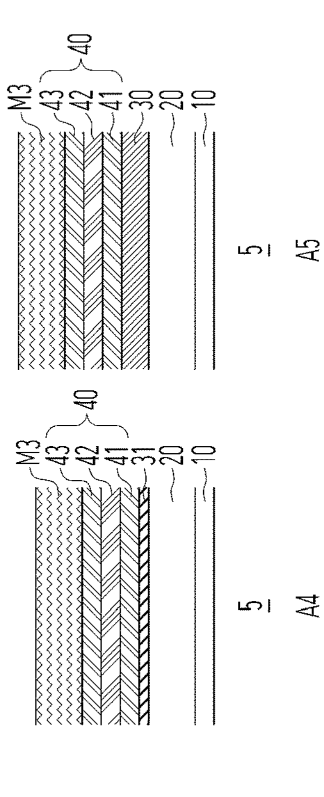
Figure 10:
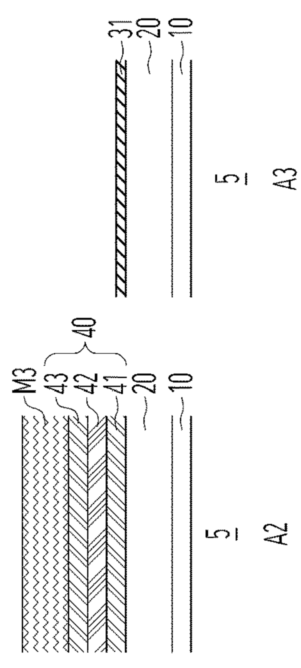
Figure 10:
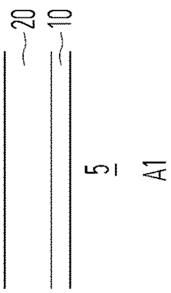

Referring to FIG. 10, the method may further include removing the dipole stack 40 exposed in the first area A1 and the third area A3 by performing an etching process. The buffer titanium-rich titanium nitride layer 31 may be exposed in the third area A3. In an embodiment, the buffer titanium-rich titanium nitride layer 31 exposed in the third area A3 may be thinned. Thereafter, the third mask pattern M3 may be removed.

Referring to FIG. 11, the method may further include entirely forming an N-type dipole material layer 51 by performing a deposition process. The N-type dipole material layer 51 may include an N-type dipole material such as lanthanum (La). In an embodiment, the N-type dipole material layer 51 may include lanthanum oxide (LaO).

Figure 12:
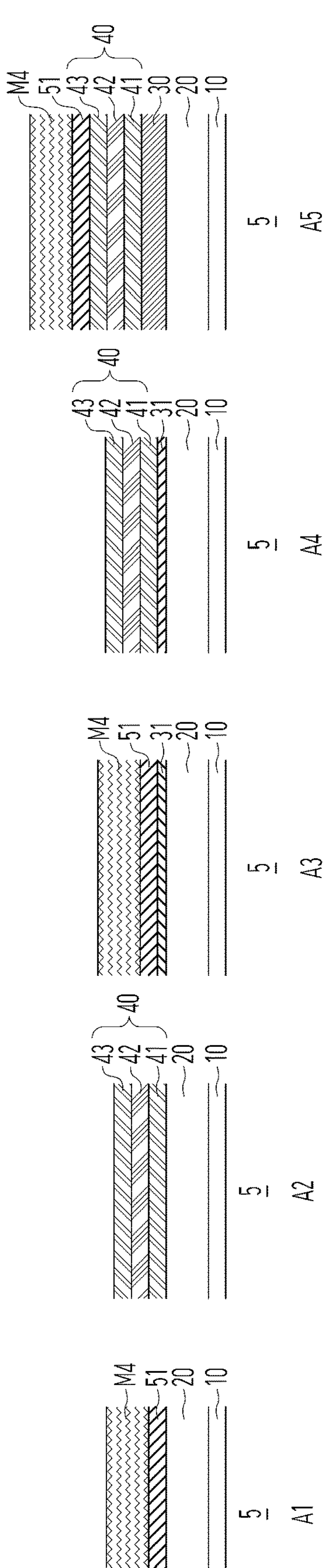

Referring to FIG. 12, the method may further include forming a fourth mask pattern M4 exposing the second area A2 and the fourth area A4, and covering the first area A1, the third area A3, and the fifth area A5. The method may further include removing the N-type dipole layer 51 exposed in the second area A2 and the fourth area A4 using the fourth mask pattern M4 as an etch mask.

Figure 13:
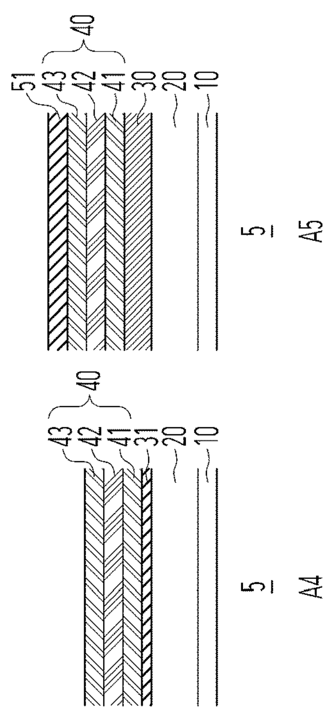
Figure 13:
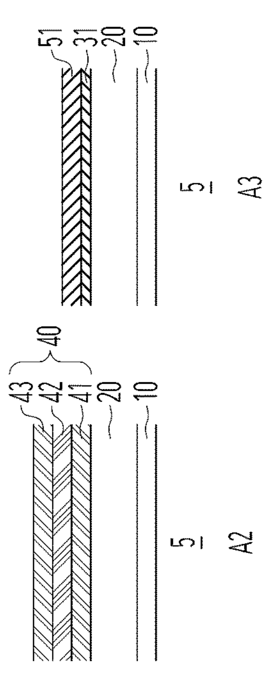
Figure 13:
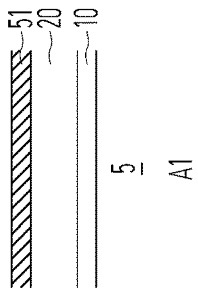

Referring to FIG. 13, the method may further include removing the fourth mask pattern M4. The N-type dipole material layer 51 may be exposed in the first area A1, the third area A3, and the fifth area A5, and the dipole stack 40 including the P-type dipole material layer 42 may be exposed in the second area A2 and the fourth area A4.

Figure 14:
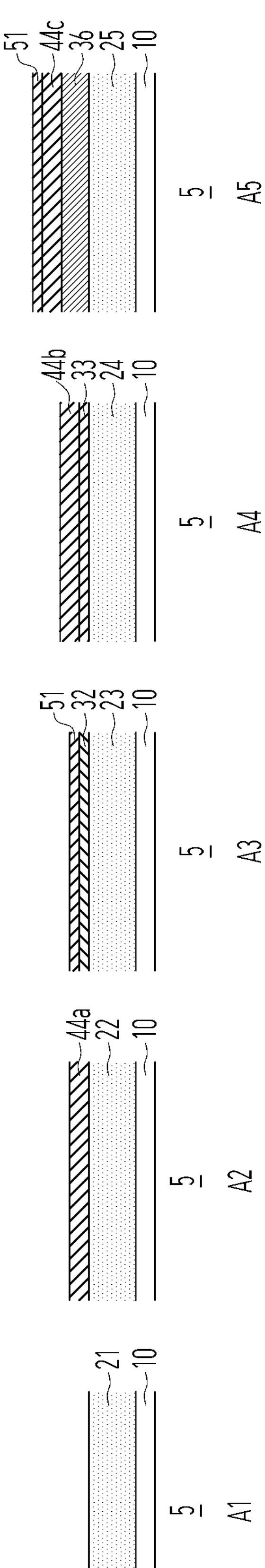

Referring to FIG. 14, the method may further include diffusing the N-type dipole material in the N-type dipole material layer 51 and the P-type dipole material in the dipole stack 40 into the high-k gate dielectric layer 20, the buffer titanium-rich titanium nitride layer 31, and the buffer titanium nitride layer 30, respectively, by performing an annealing process.

The second dipole material in the N-type dipole material layer 51 in the first area A1 may sufficiently diffuse into the high-k gate dielectric layer 20, and the high-k gate dielectric layer 20 in the first area A1 may be formed into a first N-type high-k gate dielectric layer 21. The first N-type high-k gate dielectric layer 21 may include hafnium (Hf), lanthanum (La), oxygen (O), and nitrogen (N). For example, the first N-type high-k gate dielectric layer 21 may include hafnium lanthanum oxy-nitride (HfLaON).

The P-type dipole material in the P-type dipole material layer 42 of the dipole stack 40 in the second area A2 may penetrate the lower metal layer 41 and diffuse into the high-k gate dielectric layer 20, and the high-k gate dielectric layer 20 in the second area A2 may be formed into a first P-type high-k gate dielectric layer 22. The first P-type high-k gate dielectric layer 22 may include hafnium (Hf), aluminum (Al), oxygen (O), and nitrogen (N). For example, the first P-type high-k gate dielectric layer 22 may include hafnium aluminum oxy-nitride (HfAlON).

The N-type dipole material in the N-type dipole material layer 51 in the third area A3 may penetrate the buffer titanium-rich titanium nitride layer 31 and diffuse into the high-k gate dielectric layer 20, and the high-k gate dielectric layer 20 in the third area A3 may be formed into a second N-type high-k gate dielectric layer 23. The second N-type high-k gate dielectric layer 23 may include hafnium (Hf), lanthanum (La), oxygen (O), and nitrogen (N). For example, the second N-type high-k gate dielectric layer 23 may include hafnium lanthanum oxy-nitride (HfLaON).

The P-type dipole material in the P-type dipole material layer 42 of the dipole stack 40 in the fourth area A4 may penetrate the lower metal layer 41 and the buffer titanium-rich titanium nitride layer 31 and diffuse into the high-k gate dielectric layer 20, and the high-k gate dielectric layer 20 in the fourth area A4 may be formed into a second P-type high-k gate dielectric layer 24. The second P-type high-k gate dielectric layer 24 may include hafnium (Hf), aluminum (Al), oxygen (O), and nitrogen (N). For example, the second P-type high-k gate dielectric layer 24 may include hafnium aluminum oxy-nitride (HfAlON).

The high-k gate dielectric layer 20 in the fifth area A5 may be formed into an undoped high-k gate dielectric layer 25. In the fifth area A5, the buffer titanium nitride layer 30 may prevent diffusion of the P-type dipole material and the N-type dipole material. Accordingly, the undoped high-k gate dielectric layer 25 might not include the P-type dipole material and the N-type dipole material. In an embodiment, the undoped high-k gate dielectric layer 25 may include a very low concentration of the P-type dipole material and/or a very low concentration of the N-type dipole material. That is, the undoped high-k gate dielectric layer 25 may be a very lightly-doped high-k gate dielectric layer 25.

In the second area A2, the lower metal layer 41 and the upper metal layer 43 of the dipole stack 40 may be formed into a first P-type dipole doped metal layer 44*a* containing the P-type dipole material. For example, the first P-type dipole doped metal layer 44*a* may include titanium aluminum nitride (TiAlN).

In the third area A3, the buffer titanium-rich titanium nitride layer 31 may be formed into an N-type dipole doped titanium nitride layer 32 including the N-type dipole material. For example, the N-type dipole doped titanium nitride layer 32 may include titanium lanthanum nitride (TiLaN).

In the fourth area A4, the buffer titanium-rich titanium nitride layer 31 may be formed into a P-type dipole doped titanium nitride layer 33 containing the P-type dipole material. For example, the P-type dipole doped titanium nitride layer 33 may include titanium aluminum nitride (TiAlN). In the fourth area A4, the lower metal layer 41 and the upper metal layer 43 of the dipole stack 40 may be formed into a second P-type dipole doped metal layer 44*b* including the P-type dipole material. For example, the second P-type dipole doped metal layer 44*b* may include at least one of titanium aluminum (TiAl) and titanium aluminum nitride (TiAlN). A titanium (Ti) concentration in the P-type dipole doped titanium nitride layer 33 may be higher than a titanium (Ti) concentration of the second P-type dipole doped metal layer 44*b*.

In the fifth area A5, the buffer titanium nitride layer 30 may be formed into a buffer metal layer 36 by nitrogen diffusion. The buffer metal layer 36 may include a titanium nitride (TiN) layer by the law of definite propagation. The lower metal layer 41 and the upper metal layer 43 of the dipole stack 40 may be formed into a third P-type dipole doped metal layer 44*c* by diffusion of nitrogen (N) and diffusion of aluminum (Al) from the P-type dipole material layer (42). As mentioned above, the third P-type dipole doped metal layer 44*c* may include at least one of titanium aluminum (TiAl) and titanium aluminum nitride (TiAlN).

A lanthanum (La) concentration in the first N-type high-k gate dielectric layer 21 may be higher than a lanthanum (La) concentration in the second N-type high-k gate dielectric layer 23. An aluminum (Al) concentration in the first P-type high-k gate dielectric layer 22 may be higher than an aluminum (Al) concentration in the second P-type high-k gate dielectric layer 24. A lanthanum (La) concentration in the undoped high-k gate dielectric layer 25 may be lower than the lanthanum (La) concentration in the second N-type high-k gate dielectric layer 23. An aluminum (Al) concentration in the undoped high-k gate dielectric layer 25 may be lower than the aluminum (Al) concentration in the second P-type high-k gate dielectric layer 24.

Figure 15:
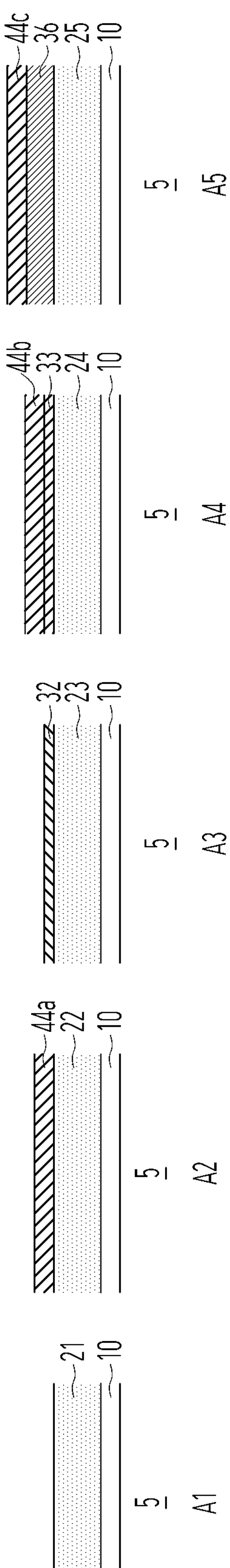

Referring to FIG. 15, the method may further include removing the N-type dipole material layer 51 remaining in the third area A3 and the fifth area A5.

Figure 16:
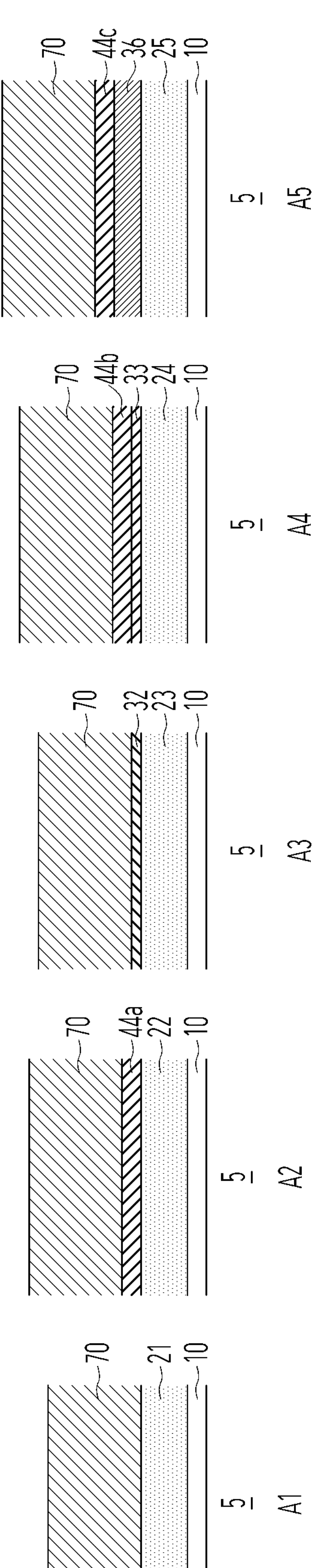

Referring to FIG. 16, the method may further include forming a gate electrode layer 70. The forming the gate electrode layer 70 may include forming a multi material layer by performing deposition processes. For example, the forming the gate electrode layer 70 may include forming a work function adjusting layer, a barrier metal layer, and a gate electrode material layer. Specifically, the work function adjusting layers may include a titanium nitride (TiN) layer and/or a doped silicon (Si) layer. The barrier metal layer may include at least one of a titanium nitride (TiN) layer and a tantalum nitride (TaN) layer. The gate electrode material layer may include a metal layer such as tungsten (W) or a metal compound layer such as titanium nitride (TiN). When the gate electrode layer 70 includes a doped silicon (Si) layer, a heat treatment process may be further performed. The dipole materials in the high-k gate dielectric layers 21 to 25 may be further stabilized by the heat treatment process.

Referring to FIG. 17, the method may further include forming a gate capping layer 80 (e.g., by performing a deposition process) and patterning the interfacial insulating layer 10, the high-k gate dielectric layers 21 to 25, the dipole doped titanium nitride layers 32 to 33, the buffer metal layer 36, the first to third P-type dipole doped metal layers 44*a* to 44*c*, and the gate electrode layer 70.

A first preliminary gate structure 101*p* including a first interfacial insulating layer 11, the first N-type high dielectric gate dielectric layer 21, a first gate electrode 71, and a first gate capping layer 81 may be formed in the first area A1.

A second preliminary gate structure 102*p* including a second interfacial insulating layer 12, the first P-type high dielectric gate dielectric layer 22, the first P-type dipole doped metal layer 44*a*, a second gate electrode 72, and a second gate capping layer 82 may be formed in the second area A2.

A third preliminary gate structure 103*p* including a third interface insulation layer 13, the second N-type high dielectric gate insulation layer 23, the N-type dipole-doped titanium nitride layer 32, a third gate electrode 73, and a third gate capping layer 83 may be formed in the third area A3.

A fourth preliminary gate structure 104*p* including a fourth interface insulation layer 14, the second P-type high dielectric gate insulation layer 24, the P-type dipole-doped titanium nitride layer 33, the second P-type dipole doped metal layer 44*b*, a fourth gate electrode 74, and a fourth gate capping layer 84 may be formed in the fourth area A4.

A fifth preliminary gate structure 105*p* including a fifth interfacial insulating layer 15, the undoped high dielectric gate dielectric layer 25, the buffer metal layer 36, the third P-type dipole doped metal layer 44*c*, a fifth gate electrode 75, and a fifth gate capping layer 85 may be formed in the fifth region A5.

Thereafter, referring to FIG. 1A, the method may further include forming first to fifth gate spacers 91 to 95 on sidewalls of the first to fifth preliminary gate structures 101*p* to 105*p*, to form gate structures 101 to 105, respectively.

In the embodiment described with reference to FIGS. 2 to 17, the P-type elements and the N-type elements may be compatible with each other.

Figure 18:
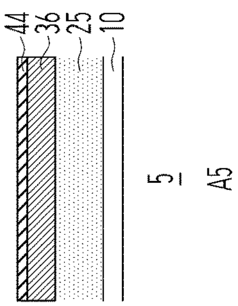
Figure 18:
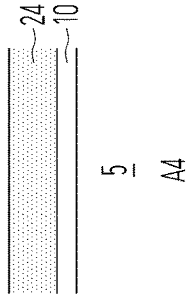
Figure 18:
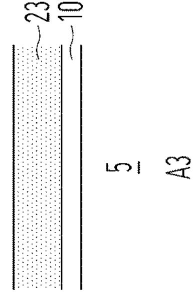
Figure 18:
Figure 18:
Figure 19:
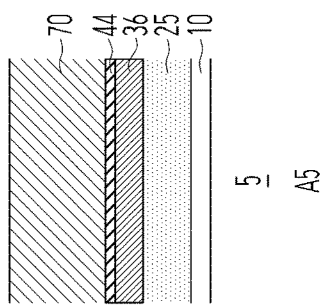
Figure 19:
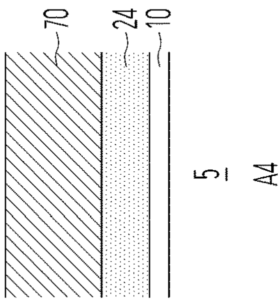
Figure 19:
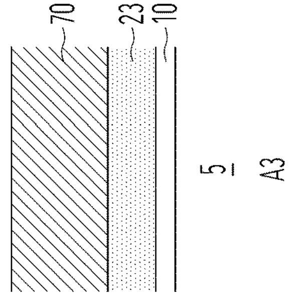
Figure 19:
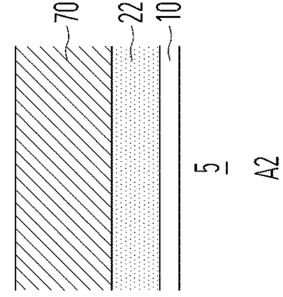
Figure 19:
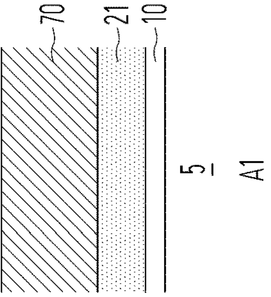

FIGS. 18 to 20 are longitudinal cross-sectional views illustrating a method of manufacturing a semiconductor device (e.g., corresponding to FIG. 1B) according to another embodiment of the present disclosure. Referring to FIG. 18, the method may include performing the processes described with reference to FIGS. 2 to 15, and removing the first P-type dipole doped metal layer 44*a* in the second area A2, the N-type dipole doped titanium nitride layer 32 in the third area A3, the P-type dipole doped titanium nitride layer 33 and the second P-type dipole doped metal layer 44*b* in the fourth area A4, and a portion of the third P-type dipole doped metal layer 44*c* in the fifth area A5. The third P-type dipole doped metal layer 44*c* may be formed into a P-type dipole doped metal layer 44.

Referring to FIG. 19, the method may further include forming a gate electrode 70.

Referring to FIG. 20, the method may further include forming a gate capping layer 80 (e.g., by performing a deposition process), and patterning the interfacial insulating layer 10, the high-k gate dielectric layers 21 to 25, the dipole doped titanium nitride layers 32 to 33, the buffer metal layer 36, the P-type dipole doped metal layer 44, and the gate electrode 70.

A first preliminary gate structure 101*p* including a first interfacial insulating layer 11, the first N-type high dielectric gate dielectric layer 21, a first gate electrode 71, and a first gate capping layer 81 may be formed in the first area A1.

A second preliminary gate structure 102*p* including a second interfacial insulating layer 12, the first P-type high dielectric gate dielectric layer 22, a second gate electrode 72, and a second gate capping layer 82 may be formed in the second area A2.

A third preliminary gate structure 103*p* including a third interfacial insulating layer 13, the second N-type high dielectric gate dielectric layer 23, a third gate electrode 73, and a third gate capping layer 83 may be formed in the third area A3.

A fourth preliminary gate structure 104*p* including a fourth interfacial insulating layer 14, the fourth gate dielectric layer 24, a fourth gate electrode 74, and a fourth gate capping layer 84 may be formed in the fourth area A4.

A fifth preliminary gate structure 105*p* including a fifth interfacial insulating layer 15, the undoped high dielectric gate dielectric layer 25, the buffer metal layer 36, the P-type dipole doped metal layer 44, a fifth gate electrode 75, and a fifth gate capping layer 85 may be formed in the fifth region A5.

Thereafter, referring to FIG. 1B, the method may further include forming gate spacers 91 to 95 on sidewalls of the first to fifth preliminary gate structures 101*p* to 105*p*, to form gate structures 101 to 105, respectively.

In the embodiment described with reference to FIGS. 18 to 20, the P-type elements and the N-type elements may be compatible with each other.

According to the embodiments of the present disclosure, the high-k gate dielectric layers of the gate structures can include various dipole materials having various concentrations. Accordingly, various high-k gate dielectric layers can provide various threshold voltages.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A semiconductor device comprising:

a first gate structure including a first N-type high-k gate dielectric layer disposed in a first area over a substrate;

a second gate structure comprising a first P-type high-k gate dielectric layer disposed in a second area over the substrate;

a third gate structure including a second N-type high-k gate dielectric layer disposed in a third area over the substrate; and a fourth gate structure including a second P-type high-k gate dielectric layer disposed in a fourth area over the substrate, wherein:

the first N-type high-k gate dielectric layer includes an N-type dipole material with a first concentration, the first P-type high-k gate dielectric layer includes a P-type dipole material with a second concentration, the second N-type high-k gate dielectric layer includes an N-type dipole material with a third concentration, the second P-type high-k gate dielectric layer includes a P-type dipole material with a fourth concentration, the first concentration is higher than the third concentration, and the second concentration is higher than the fourth concentration, wherein the first gate structure includes:

an interfacial insulating layer disposed over the substrate;

the first N-type high-k gate dielectric layer disposed over the interfacial insulating layer; and a gate electrode disposed over the first N-type high-k gate dielectric layer, and wherein the gate electrode includes at least one of a titanium nitride layer, a doped silicon layer, and a metal layer.

2. The semiconductor device according to claim 1, wherein each of the first N-type high-k gate dielectric layer and the second N-type high-k gate dielectric layer includes hafnium, lanthanum, and oxygen.

3. The semiconductor device according to claim 1, wherein each of the first P-type high-k gate dielectric layer and the second P-type high-k gate dielectric layer includes hafnium, aluminum, and oxygen.

4. The semiconductor device according to claim 1, wherein the second gate structure includes:

an interfacial insulating layer disposed over the substrate;

the first P-type high-k gate dielectric layer disposed over the interfacial insulating layer;

a P-type dipole doped metal layer disposed over the first P-type high-k gate dielectric layer; and a gate electrode disposed over the P-type dipole doped metal layer, and wherein the P-type dipole doped metal layer includes a titanium aluminum nitride layer.

5. The semiconductor device according to claim 1, wherein the third gate structure includes:

an interfacial insulating layer disposed over the substrate;

the second N-type high-k gate dielectric layer disposed over the interfacial insulating layer;

an N-type dipole doped titanium nitride layer disposed over the second N-type high-k gate dielectric layer; and a gate electrode disposed over the N-type dipole doped titanium nitride layer, and wherein the N-type dipole doped titanium nitride layer includes titanium lanthanum nitride.

6. The semiconductor device according to claim 1, wherein the fourth gate structure includes:

an interfacial insulating layer disposed over the substrate;

the second P-type high-k gate dielectric layer disposed over the interfacial insulating layer;

a P-type dipole doped material layer disposed over the second P-type high-k gate dielectric layer; and a gate electrode disposed over the P-type dipole doped material layer, and wherein the P-type dipole doped material layer includes titanium aluminum nitride.

7. The semiconductor device according to claim 1, further comprising a fifth gate structure including an undoped high-k gate dielectric layer disposed in a fifth area over the substrate, wherein the undoped high-k gate dielectric layer includes hafnium oxy-nitride.

8. The semiconductor device according to claim 7, wherein the fifth gate structure includes:

an interfacial insulating layer disposed over the substrate;

the undoped high-k gate dielectric layer disposed over the interfacial insulating layer;

a P-type dipole doped metal layer disposed over the undoped high-k gate dielectric layer; and a gate electrode disposed over the P-type dipole doped metal layer, and wherein the P-type dipole doped metal layer includes titanium aluminum.

9. The semiconductor device according to claim 8, further comprising a buffer metal layer disposed between the undoped high-k gate dielectric layer and the P-type dipole doped metal layer, wherein the buffer metal layer includes titanium nitride.

10. A semiconductor device comprising:

a first gate structure including:

a first interfacial insulating layer over a first area of a substrate, a first N-type high-k gate dielectric layer disposed over the first interfacial insulating layer, and a first gate electrode over first N-type high-k gate dielectric layer;

a second gate structure comprising:

a second interfacial insulating layer over a second area of the substrate, a first P-type high-k gate dielectric layer over the second interfacial insulating layer, and a second gate electrode over the first P-type high-k gate dielectric layer;

a third gate structure including:

a third interfacial insulating layer over a third area of the substrate, a second N-type high-k gate dielectric layer over the third interfacial insulating layer, and a third gate electrode over the second N-type high-k gate dielectric layer; and a fourth gate structure including:

a fourth interfacial insulating layer over a fourth area of the substrate, a second P-type high-k gate dielectric layer over the fourth interfacial insulating layer, and a fourth gate electrode over the P-type high-k gate dielectric layer.

11. The semiconductor device according to claim 10, wherein the second gate structure further includes a P-type dipole doped layer between the first P-type high-k gate dielectric layer and the second gate electrode.

12. The semiconductor device according to claim 10, wherein the third gate structure further includes an N-type dipole doped layer between the second N-type high-k gate dielectric layer and the third gate electrode.

13. The semiconductor device according to claim 10, wherein the fourth gate structure further includes a P-type dipole doped metallic layer between the second P-type high-k dielectric layer and the fourth gate electrode.

14. The semiconductor device according to claim 13, wherein the fourth gate structure further includes a P-type dipole doped titanium nitride layer between the second P-type high-k dielectric layer and the P-type dipole doped metallic layer.

15. The semiconductor device according to claim 10, further comprising a fifth gate structure, wherein the fifth gate structure includes:

a fifth interfacial insulating layer over a fifth area of the substrate, an undoped high-k gate dielectric layer over the fifth interfacial insulating layer, and a fifth gate electrode over the undoped high-k gate dielectric layer.

16. The semiconductor device according to claim 15, wherein the fifth gate structure further includes:

a buffer layer and a P-type dipole doped layer between the undoped high-k gate dielectric layer and the fifth gate electrode, wherein the buffer layer includes titanium nitride.

17. A semiconductor device comprising:

a first gate structure including:

a first interfacial insulating layer over a substrate, a first N-type high-k gate dielectric layer disposed over the first interfacial insulating layer, and a first gate electrode over first N-type high-k gate dielectric layer;

a second gate structure comprising:

a second interfacial insulating layer over the substrate, a first P-type high-k gate dielectric layer over the second interfacial insulating layer, a P-type dipole doped layer over the first P-type high-k gate dielectric layer, and a second gate electrode over the P-type dipole doped layer; and a third gate structure including:

a third interfacial insulating layer over the substrate, a second N-type high-k gate dielectric layer over the third interfacial insulating layer, an N-type dipole doped layer over the second N-type high-k gate dielectric layer, and a third gate electrode over the N-type dipole doped layer.

18. The semiconductor device according to claim 17, further comprising a fourth gate structure, wherein the fourth gate structure includes:

a fourth interfacial insulating layer over a fourth area of the substrate, a second P-type high-k gate dielectric layer over the fourth interfacial insulating layer, and a fourth gate electrode over the P-type high-k gate dielectric layer.

19. The semiconductor device according to claim 18, wherein the fourth gate structure further includes a P-type dipole doped metallic layer between the second P-type high-k dielectric layer and the fourth gate electrode.

20. The semiconductor device according to claim 18, wherein the fourth gate structure further includes a P-type dipole doped titanium nitride layer between the second P-type high-k dielectric layer and the P-type dipole doped metallic layer.

* * * * *